(12) United States Patent
Wang et al.

(10) Patent No.: US 12,681,088 B2
(45) Date of Patent: Jul. 14, 2026

(54) SAMPLING COMPONENT, BATTERY, ELECTRIC APPARATUS, MANUFACTURING METHOD OF SAMPLING COMPONENT, AND SAMPLING METHOD

(71) Applicant: CONTEMPORARY AMPEREX TECHNOLOGY (HONG KONG) LIMITED, Hong Kong (CN)

(72) Inventors: Chong Wang, Ningde (CN); Zhiming Chen, Ningde (CN); Chenling Zheng, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 627 days.

(21) Appl. No.: 18/166,902

(22) Filed: Feb. 9, 2023

(65) Prior Publication Data

US 2023/0184841 A1      Jun. 15, 2023

Related U.S. Application Data

(63) Continuation of application No. PCT/CN2021/122178, filed on Sep. 30, 2021.

(51) Int. Cl.
| | |
|---|---|
| *G01R 31/36* | (2020.01) |
| *H01B 7/08* | (2006.01) |
| *H01M 10/48* | (2006.01) |
| *H01M 50/569* | (2021.01) |
| *H01M 50/583* | (2021.01) |

(52) U.S. Cl.
CPC ........... *G01R 31/3644* (2013.01); *H01B 7/08* (2013.01); *H01M 10/48* (2013.01); *H01M*

*10/482* (2013.01); *H01M 50/569* (2021.01); *H01M 50/583* (2021.01); *H01M 2200/103* (2013.01)

(58) Field of Classification Search
None
See application file for complete search history.

(56) References Cited

U.S. PATENT DOCUMENTS

| | | |
|---|---|---|
| 2013/0260193 A1 | 10/2013 | Sasada et al. |
| 2020/0313139 A1 | 10/2020 | Patterson et al. |
| (Continued) | | |

FOREIGN PATENT DOCUMENTS

| | | |
|---|---|---|
| CN | 204651430 U | 9/2015 |
| CN | 209947993 U | 1/2020 |
| CN | 210378535 U | 4/2020 |
| (Continued) | | |

OTHER PUBLICATIONS

Extended European Search Report for EP application No. 21952124. 2, dated Sep. 23, 2024.

(Continued)

*Primary Examiner* — Jonathan Crepeau
(74) *Attorney, Agent, or Firm* — Ladas & Parry, LLP

(57) ABSTRACT

This application provides a sampling component, including a body portion and a lap portion. The body portion is configured to transmit a sample signal. The lap portion laps the body portion at one end and laps a point for sampling at the other end, to acquire the sample signal; and the lap portion is provided with a fusing structure configured to implement fusing protection on the body portion.

14 Claims, 6 Drawing Sheets

(56)                    References Cited

U.S. PATENT DOCUMENTS

| | | | | |
|---|---|---|---|---|
| 2021/0234239 A1* | 7/2021 | Kita | .......................... | H02J 7/00 |
| 2022/0328925 A1* | 10/2022 | Kuboki | .............. | H01M 50/516 |

FOREIGN PATENT DOCUMENTS

| | | | |
|---|---|---|---|
| CN | 111180937 | A | 5/2020 |
| CN | 211376864 | U | 8/2020 |
| CN | 112368787 | A | 2/2021 |
| CN | 113471636 | * | 10/2021 |
| JP | 2002150918 | A | 5/2002 |
| JP | 2005135823 | A | 5/2005 |
| JP | 2013206696 | A | 10/2013 |
| JP | 2017501551 | A | 12/2017 |
| JP | 2020170615 | A | 10/2020 |
| JP | 2021096926 | A | 6/2021 |
| JP | 2021111523 | A | 8/2021 |
| JP | 2022159149 | A | 10/2022 |
| WO | 2020013121 | A1 | 1/2020 |

OTHER PUBLICATIONS

Second Office Action of JP application No. 2023-509719, dated Oct. 28, 2024.
International Search Report for Application No. PCT/CN2021/ 122178, mailed Jun. 23, 2022, 6 pages.
First Office Action of JP application No. 2023-509719, dated Mar. 25, 2024.

* cited by examiner

1000

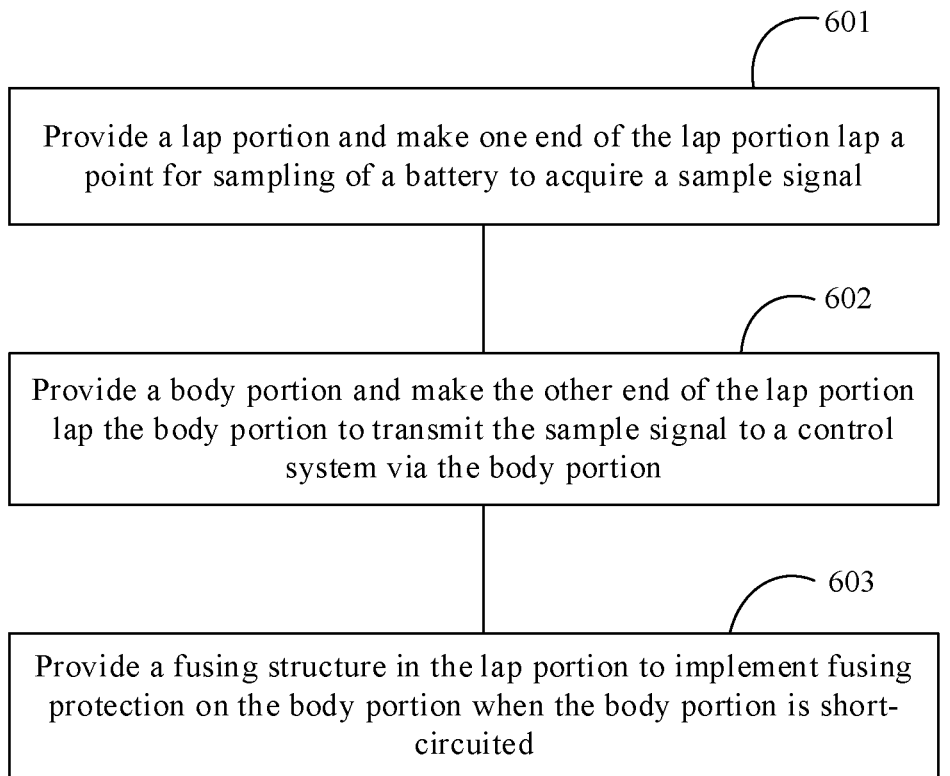

601

Provide a lap portion and make one end of the lap portion lap a point for sampling of a battery to acquire a sample signal

602

Provide a body portion and make the other end of the lap portion lap the body portion to transmit the sample signal to a control system via the body portion

603

Provide a fusing structure in the lap portion to implement fusing protection on the body portion when the body portion is short-circuited

FIG. 11

SAMPLING COMPONENT, BATTERY, ELECTRIC APPARATUS, MANUFACTURING METHOD OF SAMPLING COMPONENT, AND SAMPLING METHOD

CROSS REFERENCE TO RELATED APPLICATION

This application is a continuation of International Patent Application No. PCT/CN2021/122178, filed on Sep. 30, 2021, which is incorporated herein by reference in its entirety.

TECHNICAL FIELD

This application relates to the battery field, and specifically, to a sampling component, a battery, an electric apparatus, a manufacturing method of sampling component, and a sampling method.

BACKGROUND

Energy conservation and emission reduction are critical to sustainable development of the automobile industry. Electric vehicles, with their advantages in energy conservation and emission reduction, have become an important part of sustainable development of the automobile industry. For electric vehicles, battery technology is an important factor in connection with their development.

Extensive use of batteries is accompanied with increasing safety problems. As a battery needs to be frequently charged and discharged during use, the battery is highly prone to safety problems such as spontaneous combustion and explosion in a charge and discharge process. The inventors of this application have found in research that monitoring current in the battery effectively and providing protection in time in cases of excessively large current have become important ways to prevent safety problems of the battery.

SUMMARY

Embodiments of this application propose a sampling component, a battery, an electric apparatus, a manufacturing method of sampling component, and a sampling method to resolve the safety problems of a battery in use in the prior art.

The embodiments of this application provide a sampling component, including a body portion and a lap portion, where the body portion is configured to transmit a sample signal; the lap portion laps the body portion at one end and laps a point for sampling at the other end, to acquire the sample signal; and the lap portion is provided with a fusing structure configured to implement fusing protection on the body portion.

In the embodiments of this application, the sampling component has a changed structure and a simplified process for connection between a sampling circuit and the point for sampling, and therefore has a simple structure and is convenient and quick to maintain. In addition, the provision of the fusing portion in the lap portion implements fusing protection on the body portion. Thus, when the point for sampling and the body portion are connected via the lap portion, the purpose of fusing protection can be achieved without any additional fusing protection circuit. Such a structure is simple, greatly saving space inside the battery.

In some embodiments, the body portion includes a wire and an insulation layer, where the insulation layer wraps the surface of the wire to isolate the wire; and the wire is exposed from the insulation layer at a position corresponding to the point for sampling, where one end of the lap portion laps the wire at the exposed position.

The insulation layer of the body portion being provided with an opening at the position corresponding to the point for sampling to form the exposed position can conveniently implement electrical connection between the lap portion and the body portion and features a simple structure.

In some embodiments, the body portion includes a plurality of wires and a plurality of lap portions, where the wires are exposed from the insulation layer at positions corresponding to points for sampling respectively; and one end of each lap portion laps a respective one of the wires at the exposed position. In this way, the body portion can implement sampling on a plurality of points for sampling, improving sampling efficiency and featuring a compact structure, which saves space.

In some embodiments, the lap portion laps the body portion perpendicularly. Such manner helps guarantee connection strength between the lap portion and the body portion and also facilitates streamlined production and processing of sampling component.

In some embodiments, the lap portion includes connecting portions and a fusing portion, where the connecting portions are located at two ends of the fusing portion to connect the fusing portion to the body portion and the point for sampling. The connecting portions being disposed at two ends of the fusing portion can conveniently implement connection between the point for sampling and the body portion, with flexible and changeable connecting manners.

In some embodiments, the fusing portion includes a chip resistor or a resistance wire. The use of chip resistor or resistance wire brings simple structure, ease of manufacturing, and relatively low production cost.

In some embodiments, the fusing portion includes an etched wire. In this way, accidental fracture of the fusing portion during use of the battery can be reduced.

In some embodiments, the lap portion is a flexible flat wire, and a sectional area of the wire in the fusing portion is smaller than that of the wire in the connecting portion. The fusing portion being provided with the flexible flat wire narrowed can enable the lap portion to be formed as an entirety, making the structure simpler.

In some embodiments, the connecting portions and the fusing portion are provided with a laminating film on the surface. In the embodiments of this application, the connecting portions and the fusing portion being provided with the laminating film on the surface can enhance strength of the lap portion and better protect the lap portion.

In some embodiments, the connecting portion is disposed at the exposed position of the wire through welding, pressing, riveting or bonding, thereby implementing diversified connecting manners.

Some embodiments of this application further propose a battery, including a battery cell and the sampling component proposed in the foregoing embodiments, where the sampling component is connected to the battery cell via the lap portion to implement sampling on the battery cell.

Some embodiments of this application further propose an electric apparatus, including the battery proposed in the foregoing embodiments, where the battery is configured to supply electric energy.

Some embodiments of this application further propose a manufacturing method of sampling component. The method includes:

providing a body portion and a lap portion, where the body portion is configured to transmit a sample signal; and making one end of the lap portion lap the body portion and the other end of the lap portion lap a point for sampling to acquire the sample signal; and providing a fusing structure in the lap portion, where the fusing structure is configured to implement fusing protection on the body portion.

In some embodiments, the method further includes exposing the body portion at a position corresponding to the point for sampling and making one end of the lap portion lap a wire at the exposed position.

The sampling component produced using the above manufacturing method of sampling component has a simplified process for connection between the sampling point circuit and the sampling point, and therefore has a simple structure. In addition, the provision of the fusing portion in the lap portion implements fusing protection on the body portion. Thus, when the point for sampling and the body portion are connected via the lap portion, the purpose of fusing protection can be achieved without any additional fusing protection circuit. Such a structure is simple, greatly saving space inside the battery.

Some embodiments of this application further propose a sampling method of battery. The method includes:

providing a lap portion and making one end of the lap portion lap a point for sampling of a battery to acquire a sample signal;

providing a body portion and making the other end of the lap portion lap the body portion to transmit the sample signal to a control system via the body portion; and providing a fusing structure in the lap portion to implement fusing protection on the body portion when the body portion is short-circuited.

With the sampling method for battery proposed in the embodiments of this application, sampling can be performed conveniently on a battery with easy and effective implementation without increasing structural complexity of the battery.

BRIEF DESCRIPTION OF DRAWINGS

The accompanying drawings described herein are intended for better understanding of this application and constitute a part of this application. Illustrative embodiments and descriptions thereof in this application are intended to interpret this application without constituting any improper limitation on this application. In the accompanying drawings:

FIG. 11 is a flowchart of a sampling method of battery according to an embodiment of this application.

REFERENCE NUMBERS

Figure 1:
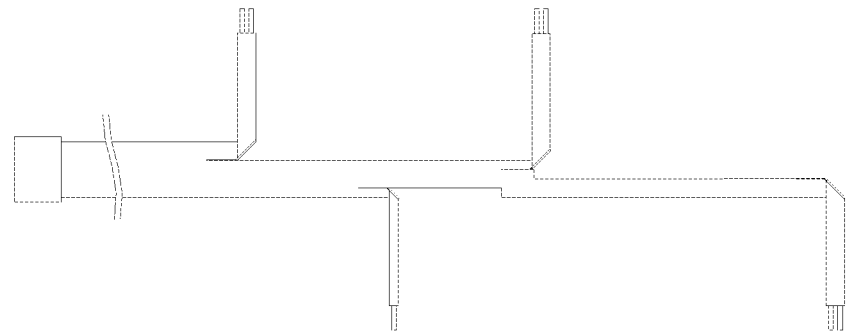
FIG. 1 is a schematic structural diagram of a commonly used sampling component.

Vehicle 1000, battery 100, box 10, upper box body 11, lower box body 12, controller 200, motor 300, battery cell 20, connector 210, sampling component 40, body portion 410, exposed position 411, exposed position 412, wire 4111, insulation layer 4112, lap portion 420, lap portion 430, connecting portion 421, first connecting portion 4211, second connecting portion 4212, and a fusing portion 422.

DETAILED DESCRIPTION

To make the objectives, technical solutions, and advantages of the embodiments of this application clearer, the following clearly describes the technical solutions in the embodiments of this application with reference to the accompanying drawings in the embodiments of this application. Apparently, the embodiments described are some rather than all embodiments of this application. All other embodiments obtained by persons of ordinary skill in the art based on the embodiments of this application without creative efforts shall fall within the protection scope of this application.

Unless otherwise defined, all technical and scientific terms used in this application shall have the same meanings as commonly understood by those skilled in the art to which this application relates. The terms used in the specification of this application are intended to merely describe the specific embodiments rather than to limit this application. The terms "include", "comprise", and any variations thereof in the specification and claims of this application as well as the foregoing description of drawings are intended to cover non-exclusive inclusions. In the specification, claims, or accompanying drawings of this application, the terms "first", "second", and the like are intended to distinguish between different objects rather than to indicate a particular order or relative importance.

Reference to "embodiment" in this application means that specific features, structures, or characteristics described with reference to the embodiment may be included in at least one embodiment of this application. The word "embodiment" appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

In the description of this application, it should be noted that unless otherwise specified and defined explicitly, the terms "mount", "connect", "join", and "attach" should be understood in their general senses. For example, they may refer to a fixed connection, a detachable connection, or an integral connection, and may refer to a direct connection, an indirect connection via an intermediate medium, or an internal communication between two elements. Persons of ordinary skills in the art can understand specific meanings of these terms in this application as appropriate to specific situations.

The term "and/or" in this application is only an associative relationship for describing associated objects, indicating that three relationships may be present. For example, A and/or B may indicate three cases: presence of only A; presence of both A and B; and presence of only B. In addition, the character "/" in this application generally indicates an "or" relationship between contextually associated objects.

In this application, "a plurality of" means more than two (inclusive). Similarly, "a plurality of groups" means more than two (inclusive) groups, and "a plurality of pieces" means more than two (inclusive) pieces.

In this application, the battery cell may include a lithium-ion secondary battery, a lithium-ion primary battery, a lithium-sulfur battery, a sodium-lithium-ion battery, a sodium-ion battery, a magnesium-ion battery, or the like. This is not limited in the embodiments of this application. The battery cell may be cylindrical, flat, cuboid, or of other shapes, which is not limited in the embodiments of this application either. Battery cells are typically divided into three types by packaging method: cylindrical cell, prismatic cell, and pouch cell. The type of battery is not limited in the embodiments of this application either.

At present, with the development of technologies, electric vehicle batteries have been increasingly widely used. Traction batteries have been widely used in energy storage power supply systems such as hydroelectric power plants, thermal power plants, wind power plants, and solar power plants, and many other fields including electric transportation tools such as electric bicycles, electric motorcycles, and electric vehicles, and military equipment and aerospace. With continuous expansion of application fields of electric vehicle batteries, market demands for the electric vehicle batteries are also expanding.

The inventors of this application have noted that an excessively large current may be present in a charge and discharge process of a battery, and such excessively large current of the battery may lead to short circuit or excessively high temperature in the battery, thereby causing spontaneous combustion, explosion, or the like. When the current in the battery is excessively large, such large current may also flow through a battery sampling circuit that is electrically connected with a battery cell. A current battery sample signal is generally transmitted to a battery management system via a flexible flat cable (FFC). The current flexible flat cable typically includes an insulator and a plurality of conductors disposed in parallel in the insulator. The conductor is a strip of equal width and has equal areas of longitudinal sections in all positions thereof. Therefore, the overall conductor has equal resistance values in all positions thereof. When a large current flows through such flexible flat cable, the flexible flat cable provides no fusing protection and causes direct damage to the battery management system.

FIG. 1 is a structural diagram of a sampling circuit discovered by the inventors of this application and commonly used for monitoring inside of a battery. The sampling circuit is disposed inside a battery. On sampling points, a flexible flat cable is cut and bent, then the flexible flat cable is directly connected to a battery cell to implement sampling on input or output signals of the battery cell. The applicant has found that when connecting the sampling circuit to the battery cell by bending the cable, a process is relatively complex; especially, precision of bending and locating is difficult to guarantee during bending; and a bending angle cannot be kept.

The inventors of this application have also found that a fusing circuit is generally directly disposed on the flexible flat cable to protect a control device in the battery management system. When a value of an input or output current of the battery cell is greater than a threshold, the fusing circuit automatically implements fusing protection. In a current fusing protection manner, after a fusing protection circuit implements fusing protection, the entire flexible flat cable needs to be scrapped, and all flexible flat circuits need to be replaced, resulting in complex maintenance operation and high maintenance cost of the battery.

Based on the above considerations, embodiments of this application propose a sampling component, a sampling method, a manufacturing method of sampling component, a corresponding battery using such sampling component, and an electric apparatus, so as to resolve the above problems in the prior art. A sampling circuit and a fusing protection circuit are integrated in the embodiments of this application to enable the sampling component to have both signal sampling and fusing protection functions. In addition, the sampling circuit and a battery cell are connected together by making two portions lap. In this way, a manner of connecting a flexible circuit to the battery cell by bending the flexible circuit is canceled, a circuit sampling process is simplified, complexity in maintenance of the battery is reduced, and safety of the battery is improved.

The sampling component, sampling method, manufacturing method of sampling component, and corresponding battery using such sampling component in the embodiments of this application may be used without limitation in electric apparatuses such as vehicles, ships, or aircrafts. The sampling component, battery, and the like disclosed in this application may be used to constitute a power supply system of the electric apparatus. This helps improve safety of the battery.

An embodiment of this application provides an electric apparatus that uses a battery as a power source. The electric apparatus may be, but is not limited to, a mobile phone, a tablet, a laptop computer, an electric toy, an electric bicycle, an electric car, a ship, or a spacecraft. The electric toy may be a fixed or mobile electric toy, for example, a game console, an electric toy car, an electric toy ship, and an electric toy airplane. The spacecraft may include an airplane, a rocket, a space shuttle, a spaceship, and the like.

For ease of description, the electric apparatus of an embodiment of this application being a vehicle 1000 is used as an example for description of the following embodiments.

Figure 2:
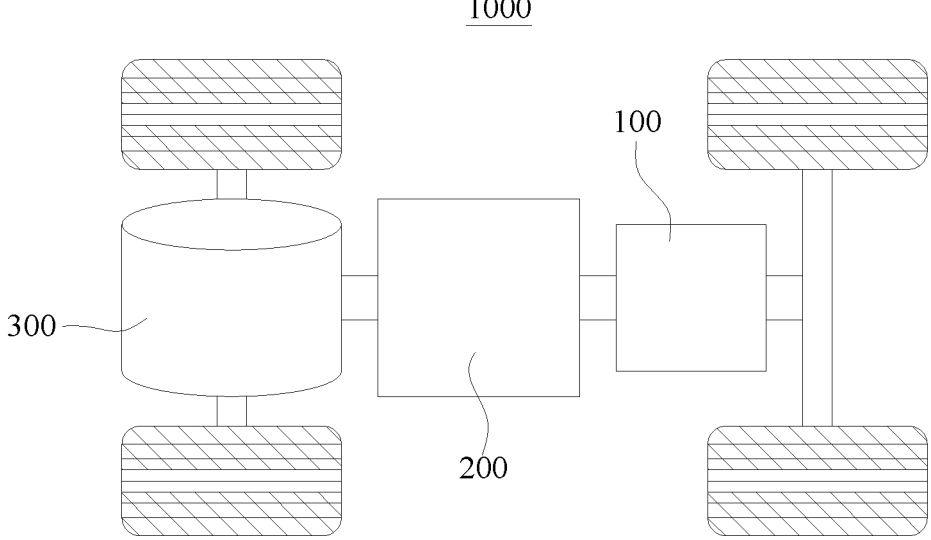
FIG. 2 is a schematic structural diagram of a vehicle according to an embodiment of this application.

Referring to FIG. 2, FIG. 2 is a schematic structural diagram of the vehicle 1000 according to an embodiment of this application. The vehicle 1000 may be a fossil fuel vehicle, a natural-gas vehicle, or a new energy vehicle, where the new energy vehicle may be a battery electric vehicle, a hybrid electric vehicle, a range-extended vehicle, or the like. The vehicle 1000 is provided with a battery 100 inside, where the battery 100 may be disposed at the bottom, front or rear of the vehicle 1000. The battery 100 may be configured to supply power to the vehicle 1000. For example, the battery 100 may be used as an operational power source for the vehicle 1000. The vehicle 1000 may further include a controller 200 and a motor 300, where the controller 200 is configured to control the battery 100 to supply power to the motor 300, for example, to satisfy power needs of start, navigation, and driving of the vehicle 1000.

In some embodiments of this application, the battery 100 can be used as not only the operational power source for the vehicle 1000 but also a driving power source for the vehicle 1000, replacing or partially replacing fossil fuel or natural gas to provide driving traction for the vehicle 1000.

Figure 3:
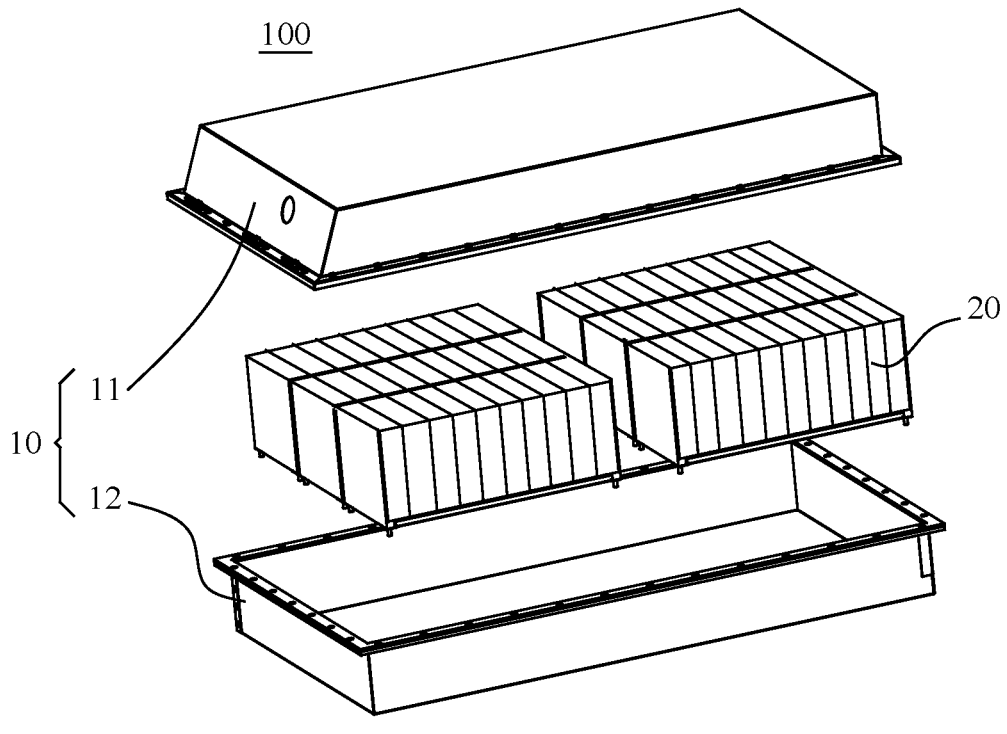
FIG. 3 is an exploded view of a battery according to an embodiment of this application.

Referring to FIG. 3, FIG. 3 is an exploded view of a battery 100 according to an embodiment of this application. The battery 100 includes a box 10 and a battery cell 20, where the battery cell 20 is accommodated in the box 10. The box 10 is configured to provide an accommodating space for the battery cell 20. The box 10 may be a variety of structures. In some embodiments, the box 10 may include an upper box body 11 and a lower box body 12, where the upper box body 11 and the lower box body 12 fit together, so that the upper box body 11 and the lower box body 12 jointly define a space for accommodating the battery cell 20. The lower box body 12 may be a hollow structure with one side open, and the upper box body 11 may be a plate structure, where the upper box body 11 covers the open side of the lower box body 12 to enable the upper box body 11 and the lower box body 12 to jointly define an accommodating space. Alternatively, the upper box body 11 and the lower box body 12 may both be hollow structures with one side open, where the open side of the upper box body 11 is engaged with the open side of the lower box body 12. Certainly, the box 10 formed by the upper box body 11 and the lower box body 12 may have a variety of shapes, for example, cylinder or cuboid.

The battery 100 mentioned in the embodiments of this application is a single physical module that includes one or more battery cells for providing a higher voltage and capacity. For example, the battery 100 mentioned in this application may include a battery module, a battery pack, or the like. The battery cell 20 may be present in plurality, and the plurality of battery cells 20 may be connected in series, parallel, or series-parallel, where being connected in series-parallel means a combination of series and parallel connections of the plurality of battery cells 20. The plurality of battery cells 20 may be directly connected in series, parallel or series-parallel, and then an entirety of the plurality of battery cells 20 is accommodated in the box 10; or certainly, the battery 100 may be formed by a plurality of battery cells 20 being connected in series, parallel or series-parallel first to form a battery module and then a plurality of battery modules being connected in series, parallel or series-parallel to form an entirety which is accommodated in the box 10. The battery 100 may further include other structures. For example, the battery 100 may further include a busbar configured to implement electrical connection between the plurality of battery cells 20.

Each battery cell 20 may be a lithium-ion secondary battery, a lithium-ion primary battery, a lithium-sulfur battery, a sodium-lithium-ion battery, or a magnesium-ion battery, without being limited thereto. The battery cell 20 may be cylindrical, flat, cuboid, or of other shapes.

Figure 4:
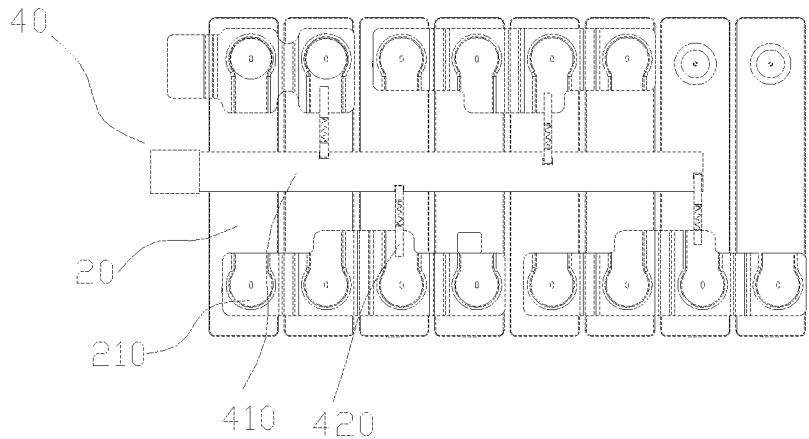
FIG. 4 is a schematic structural diagram of a battery according to an embodiment of this application.

As shown in FIG. 4, in the battery 100, each battery cell 20 is provided with a positive electrode terminal and a negative electrode terminal that are used for outputting power source. The positive electrode terminals of the plurality of battery cells 20 are connected together via connectors 210, and the negative electrode terminals of the plurality of battery cells 20 are also connected together via connectors 210, so as to form different battery groups, thereby implementing series connection or parallel connection of different battery cells. When the battery cells are sampled, each battery cell may be sampled, or the battery group may be used as a unit for sampling. When the battery group is used as a unit for sampling, the sampling component needs only to be connected to each battery group for sampling.

Figure 5:
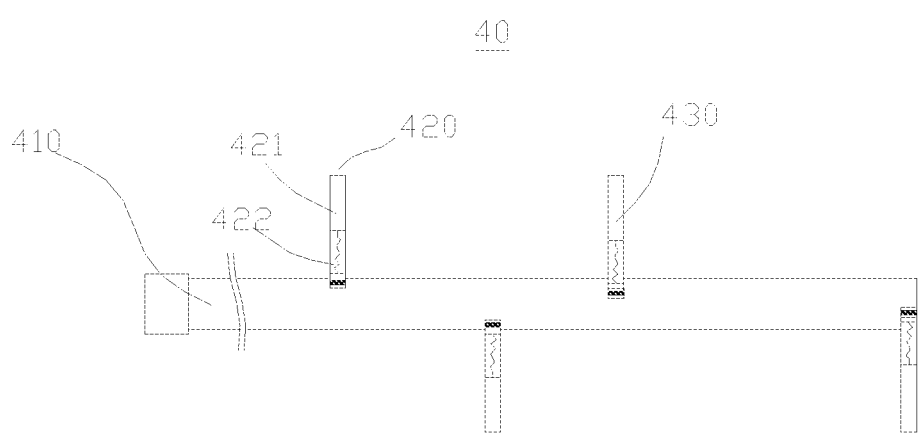
FIG. 5 is a schematic structural diagram of a sampling component according to an embodiment of this application.

FIG. 4 and FIG. 5 are schematic diagrams of application of a sampling component 40 according to an embodiment of this application. The sampling component 40 includes a body portion 410 and a lap portion 420, where the body portion 410 is configured to transmit a sample signal; the lap portion 420 laps the body portion 410 at one end and laps a point for sampling at the other end, to acquire the sample signal; and the lap portion is provided with a fusing structure 422 configured to implement fusing protection on the body portion 410.

As shown in FIG. 4, the sampling component 40 is applied to a battery for implementing sampling on battery cells or battery groups in the battery, where the battery includes a plurality of battery cells 20. The plurality of battery cells 20 are combined together via connectors 210 to form the battery groups. Each battery group is a sampling point of the battery. The sampling component 40 implements sampling on the battery groups.

The sampling component 40 includes a body portion 410 and a plurality of lap portions 420. The body portion 410 is disposed on a surface of an end of each battery cell 20, is typically disposed at an end of an electrode terminal in a height direction of the battery cell, and penetrates through surfaces of the plurality of battery cells 20, helping the body portion 410 be connected to all battery groups for sampling. The body portion 410 may be a flexible flat cable, which is convenient for wiring inside the battery. The body portion 410 is configured to transmit a sample signal and includes a plurality of cable lines, so that the body portion 410 can be connected to a plurality of lap portions 420 to simultaneously transmit sample signals of a plurality of points for sampling.

One end of each lap portion 420 is electrically connected with the body portion 410 and the other end thereof is electrically connected with the point for sampling to acquire a sample signal. The number of the lap portions 420 is the same as the number of the points for sampling, that is, the same as the number of the battery groups for sampling. The lap portion 420 and the body portion 410 are disposed separately, so that the points for sampling and the body portion 410 of the sampling component 40 can be connected conveniently without cutting and then bending of the body portion, thereby leading to convenient connection and simple process.

In addition, the lap portion 420 is provided with a fusing structure 422, where the fusing structure 422 is configured to implement fusing protection on the body portion 410. The fusing structure 422 is directly disposed together with the lap portion 420. Thus, when the point for sampling and the body portion 410 are connected via the lap portion 420, the purpose of fusing protection can be achieved without any additional fusing protection circuit. Such a structure is simple, greatly saving space inside the battery. In addition, when there is one fusing structure 422 implementing fusing protection, only the lap portion 420 fused may be replaced instead of the whole flexible flat circuit, thereby leading to convenient and quick maintenance and low cost.

FIG. 5 is a structural diagram of the sampling component 40 according to an embodiment of this application. The body portion 410 is a strip flexible flat circuit and is provided with an interface connected to a sampling control circuit. In addition, the lap portion 420 laps the body portion 410 at a position corresponding to the point for sampling, where the lap portion 420 may be electrically connected with the body portion 410 through manners such as welding. The position for the lap portion 420 lapping the body portion 410 may be selected according to a position of a battery group for sampling. In actual use, the lap portion 420 may be predisposed at a corresponding position of the body portion 410 according to a position of the point for sampling of a battery to form an entirety with the body portion 410. The lap portion 420 may also be disposed according to an actual sampling point when the body portion 410 is disposed on the surface of the battery for sampling.

In the embodiments of this application, the sampling component has a changed structure and is divided into the body portion and the lap portion, where the lap portion may lap freely according to the position of the sampling point. In this way, the sampling component has a simplified process for connection between the sampling circuit and the point for sampling, and therefore has a simple structure. In addition, the provision of the fusing portion in the lap portion implements fusing protection on the body portion. Thus, when the point for sampling and the body portion are connected via the lap portion, the purpose of fusing protection can be achieved without any additional fusing protection circuit. Such a structure is simple, greatly saving space inside the battery.

Figure 6:
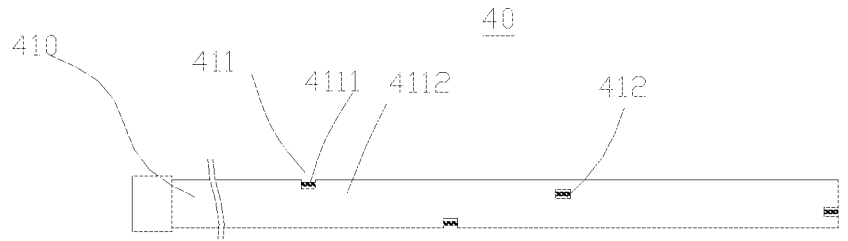
FIG. 6 is a schematic diagram of a body portion of a sampling component according to an embodiment of this application.

In some embodiments, as shown in FIG. 5 and FIG. 6, the body portion 410 includes a wire 4111 and an insulation layer 4112, where the insulation layer 4112 wraps the surface of the wire 4111 to isolate the wire; and the wire 4111 is exposed from the insulation layer 4112 at a position corresponding to the point for sampling, where one end of the lap portion laps the wire at an exposed position 411.

The body portion 410 of the sampling component 40 is a flexible flat circuit. The body portion 410 includes a plurality of wires 4111, where the insulation layer 4112 wraps the surfaces of the wires 4111 to isolate the wires and prevent short circuit between the wires. The plurality of wires 4111 being provided can implement sampling on a plurality of sampling points simultaneously. As shown in FIG. 5, a plurality of lap portions 420 lap the body portion 410, and the lap portions 420 lap different positions of the body portion 410 respectively. To make the lap portion 420 lap the body portion 410, the insulation layer 4112 of the body portion 410 is provided with an opening at a position corresponding to a point for sampling to form the exposed position 411. The lap portion 420 is connected to the wire of the body portion 410 at the exposed position 411. The wire of the body portion 410 is electrically connected with the lap portion 420 through welding or other manners.

The insulation layer 4112 of the body portion 410 being provided with an opening at the position corresponding to the point for sampling to form the exposed position 411 can conveniently implement electrically connection between the lap portion 420 and the body portion 410 and features a simple structure.

In some embodiments, the body portion 410 includes a plurality of wires 4111 and a plurality of lap portions 420. The wire 4111 is exposed from the insulation layer 4112 at a position corresponding to the point for sampling. One end of each lap portion 420 laps a respective one of the wires at the exposed position 411. For example, as shown in FIG. 5 and FIG. 6, the lap portion 420 laps the exposed position 411, and a lap portion 430 laps an exposed position 412.

As shown in FIG. 4 and FIG. 5, the body portion 410 includes a plurality of wires 4111 and is able to implement sampling on a plurality of points for sampling simultaneously. An exposed position is provided on the insulation layer 4112 at positions corresponding to the points for sampling. It should be noted that a circuit for sampling on the points for sampling is an independent circuit. Therefore, when implementing sampling on the plurality of points for sampling, the lap portions 420 need to be connected with different wires respectively. Positions at which exposed positions 411 are provided need to be staggered to prevent short circuit. One body portion 410 being connected to a plurality of lap portions 420 implements sampling on the plurality of points for sampling simultaneously, thereby improving sampling efficiency.

In some embodiments, the lap portion 420 laps the body portion 410 perpendicularly. As shown in FIG. 5, the lap portion 420 laps the body portion 410, where the lapping manner may be determined according to a position of the point for sampling and a position of the exposed position 411 of the body portion 410. Preferably, the lap portion 420 laps the body portion 410 perpendicularly. To be specific, the lap portion 420 laps the body portion 410 at a perpendicular angle of 90 degrees, which helps guarantee connection strength between the lap portion 420 and the body portion 410 and also facilitates streamlined production and processing of the sampling component 40.

In some embodiments, the lap portion 420 includes connecting portions 421 and a fusing portion 422. The connecting portions 421 include a first connecting portion 4211 and a second connecting portion 4212, where the first connecting portion 4211 and the second connecting portion 4212 are located at two ends of the fusing portion 422 respectively to connect the fusing portion 422 to the body portion 410 and the point for sampling.

Figure 7:
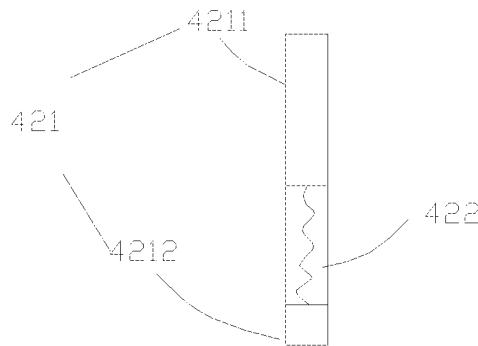
FIG. 7 is a schematic structural diagram of a lap portion according to an embodiment of this application.
Figure 8:
FIG. 8 is a schematic structural diagram of another lap portion according to an embodiment of this application.
Figure 8:
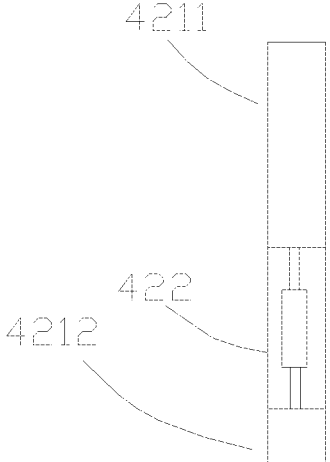

As shown in FIG. 7 and FIG. 8, the first connecting portion 4211 and the second connecting portion 4212 are located at two ends of the fusing portion 422 respectively. The connecting portions and the fusing portion may form an integrated structure through one of the manners such as welding, pressing, riveting, or bonding, or any combination thereof. The first connecting portion 4211 and the second connecting portion 4212 may be made of a same material or different materials. Generally, the connecting portion may use a flexible circuit or may be made of a conductive material such as copper foil or aluminum foil. If the first connecting portion 4211 and the second connecting portion 4212 are made of different materials, the first connecting portion 4211 is configured to connect a point for sampling. Since the point for sampling is generally a battery cell or a connector for connecting the battery cell, to guarantee connection strength between the first connecting portion 4211 and the battery cell, the first connecting portion 4211 may be a circuit structure with specified strength, for example, a nickel sheet, a copper sheet, an aluminum sheet or another composite material. The second connecting portion 4212 connects to the body portion 410, and the body portion 410 generally uses a flexible circuit, so that the second connecting portion 4212 may also use a flexible circuit the same as the body portion 410 to better lap the body portion 410. Therefore, the connecting portions 421 may be selected freely based on actual circuit conditions.

The connecting portions being disposed at two ends of the fusing portion 422 respectively can conveniently implement connection between the point for sampling and the body portion with a flexible and changeable connecting manner.

In some embodiments, the fusing portion 422 includes a chip resistor or a resistance wire. As shown in FIG. 7 and FIG. 8, to meet requirements of different sampling circuits, the fusing portion 422 may be of many forms, for example, a resistance wire shown in FIG. 7 or a chip resistor shown in FIG. 8. The use of chip resistor or resistance wire brings simple structure, ease of manufacturing, and relatively low production cost.

In some embodiments, the fusing portion 422 includes an etched wire. As a battery frequently shakes during use, to enhance strength of the lap portion 420, an etched wire may be provided on a PCB circuit board or an FPC flexible board to implement fusing protection. In this way, accidental fracture of the fusing portion during use of the battery can be reduced.

Figure 9:
FIG. 9 is a schematic structural diagram of still another lap portion according to an embodiment of this application.
Figure 9:
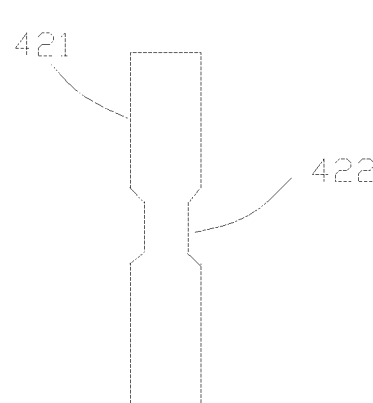

In some embodiments, as shown in FIG. 9, the lap portion 420 is a flexible flat wire, and a sectional area of the wire in the fusing portion 420 is smaller than that of the wire in the connecting portion 421. The lap portion 420 shown in the embodiments of this application may also be a flexible flat wire combining the connecting portions 421 and the fusing portion 422 together with a more compact structure. To implement fusing protection, a position of the flexible flat wire in the embodiments of this application may be narrowed to reduce width of the wire at this position to form the fusing portion 422. As the fusing portion has a width smaller than that of other portions, when a current reaches a specified intensity, the narrowed portion is fused first, implementing fusing protection. The fusing portion being provided with the flexible flat wire narrowed can enable the lap portion to be formed as an entirety, making the structure simpler.

In some embodiments, the connecting portions 421 and the fusing portion 422 are provided with a laminating film on the surface. As a battery frequently shakes during use, strength of the lap portion 420 becomes extremely important. Insufficient strength of the lap portion 420 leads to fracture during shaking, causing the battery cell not able to supply power. In the embodiments of this application, the connecting portions 421 and the fusing portion 422 being provided with the laminating film on the surface can enhance strength of the lap portion 420 and better protect the lap portion 420.

In some embodiments, the connecting portion 421 is disposed at the exposed position of the wire through welding, pressing, riveting or bonding. The connecting portion may be made of a material such as a nickel sheet, a copper sheet, an aluminum sheet, or another composite material. To connect the lap portion 420 to the body portion 410, the connecting portion and the wire of the body portion 410 are connected together through welding, pressing, riveting, or bonding, thereby implementing various connecting manners.

Some embodiments of this application further propose a battery. The battery includes a battery cell 20 and any sampling component 40 mentioned in the foregoing embodiments. As shown in FIG. 4, a plurality of battery cells 20 are connected together in series or parallel via connectors 210. A sampling component 40 is provided on a side of the battery cell 20. The sampling component 40 includes a body portion 410 and a lap portion 420. The lap portion 420 connects a point for sampling with the body portion 410 so that a connection process is simplified. In addition, the lap portion 420 is also provided with a fusing portion, where the fusing portion automatically implements fusion protection when an excessively large current flows through the battery cell. With the sampling component proposed in the embodiments of this application, the battery proposed in the embodiments of this application has a more compact structure and a better sampling effect.

Some embodiments of this application further provide an electric apparatus. The electric apparatus includes the battery proposed in the foregoing embodiments, where the battery is configured to supply electric energy to the electric apparatus. The electric apparatus may be, but is not limited to, a mobile phone, a tablet, a laptop computer, an electric toy, an electric tool, an electric bicycle, an electric car, a ship, or a spacecraft. The electric toy may be a fixed or mobile electric toy, for example, a game console, an electric toy car, an electric toy ship, and an electric toy airplane. The spacecraft may include an airplane, a rocket, a space shuttle, a spaceship, and the like.

Figure 10:
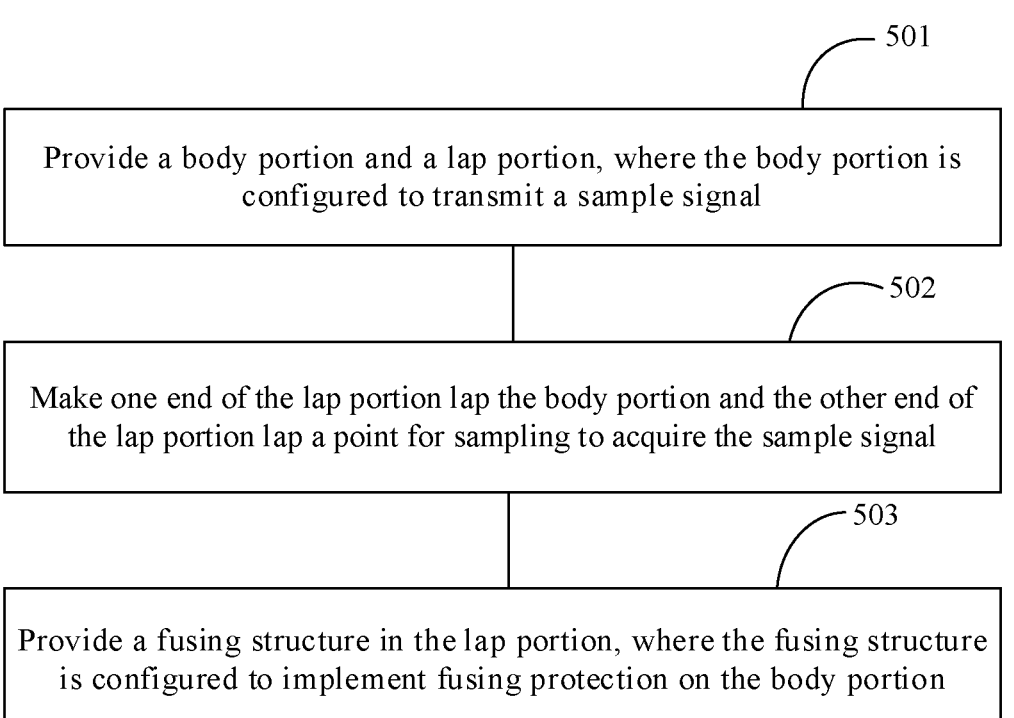
FIG. 10 is a flowchart of a manufacturing method of sampling component according to an embodiment of this application.

In some embodiments, the embodiments of this application further propose a manufacturing method of sampling component. The method is used for producing and manufacturing the sampling component proposed in the foregoing embodiments. The manufacturing method is generally performed on a production device of sampling component. The production device includes one or more components configured to perform the manufacturing method. Specifically, as shown in FIG. 10, the manufacturing method of sampling component includes the following steps.

Step 501: Provide a body portion and a lap portion, where the body portion is configured to transmit a sample signal.

Step 502: Make one end of the lap portion lap the body portion and the other end of the lap portion lap a point for sampling to acquire the sample signal.

Step 503: Provide a fusing structure in the lap portion, where the fusing structure is configured to implement fusing protection on the body portion.

The sampling component produced using the above manufacturing method of sampling component has a simplified process for connection between the sampling point circuit and the sampling point, and therefore has a simple structure. In addition, the provision of the fusing portion in the lap portion implements fusing protection on the body portion. Thus, when the point for sampling and the body portion are connected via the lap portion, the purpose of fusing protection can be achieved without any additional fusing protection circuit. Such a structure is simple, greatly saving space inside the battery.

In some embodiments, the manufacturing method further includes exposing the body portion at a position corresponding to the point for sampling and making one end of the lap portion lap a wire at the exposed position. The body portion being provided with an opening at the position corresponding to the point for sampling to form the exposed position can conveniently implement electrical connection between the lap portion and the body portion and features a simple structure.

In some embodiments, this application further proposes a sampling method of battery. With the method, sampling can be performed conveniently on a battery without increasing structural complexity of the battery. Specifically, as shown in FIG. 11, the method includes the following steps.

Step 601: Provide a lap portion and make one end of the lap portion lap a point for sampling of a battery to acquire a sample signal.

Step 602: Provide a body portion and make the other end of the lap portion lap the body portion to transmit the sample signal to a control system via the body portion.

Step 603: Provide a fusing structure in the lap portion to implement fusing protection on the body portion when the body portion is short-circuited.

With the sampling method for battery provided in the embodiments of this application, sampling can be performed conveniently on a battery with easy and effective implementation without increasing structural complexity of the battery.

In conclusion, it should be noted that the foregoing embodiments are merely intended for describing the technical solutions of this application, but not for limiting this application. Although this application is described in detail with reference to the foregoing embodiments, persons of ordinary skills in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A sampling component, comprising a body portion and a lap portion, wherein
   the body portion is configured to transmit a sample signal; and
   the lap portion laps the body portion at one end and laps a point for sampling at the other end, to acquire the sample signal; and the lap portion is provided with a fusing structure configured to implement fusing protection on the body portion;
   wherein the lap portion comprises connecting portions and a fusing portion, wherein the connecting portions include a first connecting portion and a second connecting portion, wherein
   the first connecting portion is located at one end of the fusing portion to connect the fusing portion to the point of sampling; and the second connecting portion is located at the other end of the fusing portion to connect the fusing portion to the body portion;
   wherein the second connecting portion uses a flexible circuit the same as the body portion and the first connecting portion is made of a different material to that of the second connecting portion and has a stronger structural strength to that of the second connecting portion.

2. The sampling component according to claim 1, wherein the body portion comprises a wire and an insulation layer, the insulation layer wraps the surface of the wire to isolate the wire, and the wire is exposed from the insulation layer at a position corresponding to the point for sampling, wherein the one end of the lap portion laps the wire at the exposed position.

3. The sampling component according to claim 1, wherein the body portion comprises a plurality of wires and a plurality of lap portions, wherein
   the wires are exposed from the insulation layer at positions corresponding to points for sampling respectively; and
   the one end of each lap portion laps a respective one of the wires at the exposed position.

4. The sampling component according to claim 1, wherein the lap portion laps the body portion perpendicularly.

5. The sampling component according to claim 1, wherein the fusing portion comprises a chip resistor or a resistance wire.

6. The sampling component according to claim 1, wherein the fusing portion comprises an etched wire.

7. The sampling component according to claim 1, wherein one of the first and second connecting portions of the lap portion is a flexible flat wire, and a sectional area of the wire in the fusing portion is smaller than that of the wire in the connecting portion.

8. The sampling component according to claim 1, wherein the first and second connecting portions and the fusing portion are provided with a laminating film on the surface.

9. The sampling component according to claim 1, wherein the second connecting portion is disposed at an exposed position of a wire in the body portion through welding, pressing, riveting or bonding.

10. A battery, comprising:
   a battery cell; and
   the sampling component according to claim 1,
   wherein the sampling component is connected to the battery cell via the lap portion to implement sampling on the battery cell.

11. An electric apparatus, comprising the battery according to claim 10, wherein the battery is configured to supply electric energy.

12. A method for manufacturing a sampling component, comprising:
   providing a body portion and a lap portion, wherein the body portion is configured to transmit a sample signal;
   making one end of the lap portion lap the body portion and the other end of the lap portion lap a point for sampling to acquire the sample signal; and
   providing a fusing structure in the lap portion, wherein the fusing structure is configured to implement fusing protection on the body portion
   wherein the lap portion comprises connecting portions and a fusing portion, wherein the connecting portions include a first connecting portion and a second connecting portion, wherein
   the first connecting portion is located at one end of the fusing portion to connect the fusing portion to the point of sampling; and the second connecting portion is located at the other end of the fusing portion to connect the fusing portion to the body portion;
   wherein the second connecting portion uses a flexible circuit the same as the body portion and the first connecting portion is made of a different material to that of the second connecting portion and has a stronger structural strength to that of the second connecting portion.

13. The method according to claim 12, wherein the body portion comprises an insulated wire exposed at a position corresponding to the point for sampling, wherein the second connecting portion laps the wire at the exposed position.

14. A method for sampling a battery, comprising:
   providing a lap portion and making one end of the lap portion lap a point for sampling of a battery to acquire a sample signal;
   providing a body portion and making the other end of the lap portion lap the body portion to transmit the sample signal to a control system via the body portion; and
   providing a fusing structure in the lap portion to implement fusing protection on the body portion when the body portion is short-circuited;
   wherein the lap portion comprises connecting portions that include a first connecting portion and a second connecting portion, wherein
   the first connecting portion is located at one end of the fusing structure to connect the fusing portion to the point of sampling; and the second connecting portion is located at the other end of the fusing structure to connect the fusing structure to the body portion;
   wherein the second connecting portion uses a flexible circuit the same as the body portion and the first connecting portion is made of a different material to that of the second connecting portion and has a stronger structural strength to that of the second connecting portion.

* * * * *